US 8,049,325 B2

(12) United States Patent
Mu-Seob et al.

(10) Patent No.: US 8,049,325 B2
(45) Date of Patent: Nov. 1, 2011

(54) INTEGRATED CIRCUIT DEVICES HAVING PRINTED CIRCUIT BOARDS THEREIN WITH STAGGERED BOND FINGERS THAT SUPPORT IMPROVED ELECTRICAL ISOLATION

(75) Inventors: Shin Mu-Seob, Chungcheongnam-do (KR); Tae-Hun Kim, Gyeonggi-do (KR); Min-Gi Hong, Chungcheongnam-do (KR); Shin Kim, Chungcheongnam-do (KR); Tae-Hun Yoon, Chungcheongnam-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 164 days.

(21) Appl. No.: 12/472,725

(22) Filed: May 27, 2009

(65) Prior Publication Data

US 2010/0127381 A1 May 27, 2010

(30) Foreign Application Priority Data

Nov. 25, 2008 (KR) ........................ 10-2008-0117700

(51) Int. Cl.
 *H01L 23/538* (2006.01)
(52) U.S. Cl. ................. 257/692; 257/738; 257/E23.014
(58) Field of Classification Search ................... 257/700, 257/701, 737, 738, 778, E23.06, E21.506, 257/692, 773, 735, 774, E23.014, E23.079, 257/E23.174, E23.175; 438/614, 107, 108, 438/109
See application file for complete search history.

(56) References Cited

U.S. PATENT DOCUMENTS

| 5,674,785 A | * | 10/1997 | Akram et al. | ................... 438/15 |
| 5,787,575 A | | 8/1998 | Banerjee et al. | |
| 6,847,123 B2 | * | 1/2005 | Blackwood | ................... 257/786 |

FOREIGN PATENT DOCUMENTS

| EP | 1 049 162 A2 | 11/2000 |
| JP | 06-045497 | 2/1994 |
| JP | 06-181279 | 6/1994 |
| KR | 1020000001452 A | 1/2000 |
| KR | 1020000071795 A | 11/2000 |

* cited by examiner

*Primary Examiner* — Roy Potter
(74) *Attorney, Agent, or Firm* — Myers Bigel Sibley & Sajovec, P.A.

(57) ABSTRACT

An integrated circuit substrate includes an integrated circuit chip having a plurality of electrically conductive pads on a surface thereof and a printed circuit board mounted to the integrated circuit chip. The printed circuit board includes an alternating arrangement of first and second electrically conductive bond fingers. These first and second bond fingers are elevated at first and second different heights, respectively, relative to the plurality of electrically conductive pads. The printed circuit board also includes a first plurality of electrically insulating pedestals supporting respective ones of the first electrically conductive bond fingers at elevated heights relative to the second electrically conductive bond fingers. First and second pluralities of electrical interconnects (e.g., wires, beam leads) are also provided. The first plurality of electrical interconnects operate to electrically connect first ones of the plurality of electrically conductive pads to respective ones of the first electrically conductive bond fingers. The second plurality of electrical interconnects electrically connect second ones of the plurality of electrically conductive pads to respective ones of the second electrically conductive bond fingers.

14 Claims, 13 Drawing Sheets

US 8,049,325 B2

INTEGRATED CIRCUIT DEVICES HAVING PRINTED CIRCUIT BOARDS THEREIN WITH STAGGERED BOND FINGERS THAT SUPPORT IMPROVED ELECTRICAL ISOLATION

REFERENCE TO KOREAN PRIORITY APPLICATION

This application claims priority to Korean Application No. 2008-117700, filed Nov. 25, 2008, the disclosure of which is hereby incorporated herein by reference.

FIELD OF THE INVENTION

The present invention relates to solar cells and methods of forming same and, more particularly, to semiconductor solar cells and methods of forming same.

BACKGROUND OF THE INVENTION

Integrated circuit chips having a two-dimensional array of pads (e.g., input/output pads) thereon may be electrically connected to printed circuit boards using conventional flip-chip bonding techniques. These bonding techniques may employ solder bumps (a/k/a "solder balls" or "solder bonds") connected to each of a plurality of the pads in the two-dimensional array. However, flip-chip bonding techniques are not suitable for all chip-to-board interconnect applications. For example, wire bonding techniques may be used to electrically interconnect printed circuit boards to integrated circuit chips having contact pads thereon that are closely arranged along a periphery (e.g., sides) or other contact region therein. But, as the degree of integration increases within integrated circuit chips, the spacing between adjacent contact pads may decrease as the number of contact pads increases to support the higher integration. Unfortunately, the reduced spacing between adjacent contact pads may result in an unacceptable increase in device failure caused by electrical shorting between adjacent wire bonds contacting adjacent contact pads. To address this potential reduction in device reliability, wire bonds of different length may be used to contact pads having a greater spacing therebetween. However, the use of wire bonds of different length may cause a deterioration in the electrical characteristics of the chip by causing, among other things, non-uniform signal delay between pads generating and receiving synchronized data and signals.

SUMMARY OF THE INVENTION

An integrated circuit substrate according to embodiments of the present invention includes an integrated circuit chip having a plurality of electrically conductive pads on a surface thereof and a printed circuit board mounted to the integrated circuit chip. The printed circuit board includes an alternating arrangement of first and second electrically conductive bond fingers. These first and second bond fingers are elevated at first and second different heights, respectively, relative to the plurality of electrically conductive pads. The printed circuit board also includes a first plurality of electrically insulating pedestals supporting respective ones of the first electrically conductive bond fingers at elevated heights relative to the second electrically conductive bond fingers. First and second pluralities of electrical interconnects (e.g., wires, beam leads) are also provided. The first plurality of electrical interconnects operate to electrically connect first ones of the plurality of electrically conductive pads to respective ones of the first electrically conductive bond fingers. The second plurality of electrical interconnects electrically connect second ones of the plurality of electrically conductive pads to respective ones of the second electrically conductive bond fingers. These first and second electrical interconnects are preferably configured to have equivalent lengths in order to provide equivalent resistive and reactive loads to the electrically conductive pads.

According to some of the embodiments of the present invention, the first plurality of electrically insulating pedestals may be configured to provide electrical confinement. In particular, each of the second electrically conductive bond fingers can be at least partially confined on opposing sides by a pair of the first plurality of electrically insulating pedestals.

According to still further embodiments of the present invention, the integrated circuit chip may be flip-chip mounted to the printed circuit board and the first and second plurality of electrical interconnects may be provided as solder bonds. Moreover, the integrated circuit chip may be flip-chip mounted to a first side of the printed circuit board containing the alternating arrangement of the first and second electrically conductive bond fingers and a second side of the printed circuit board may include a plurality of substrate pads thereon that are electrically connected by through-substrate vias to the first and second electrically conductive bond fingers.

DETAILED DESCRIPTION OF PREFERRED EMBODIMENTS

Figure 1:
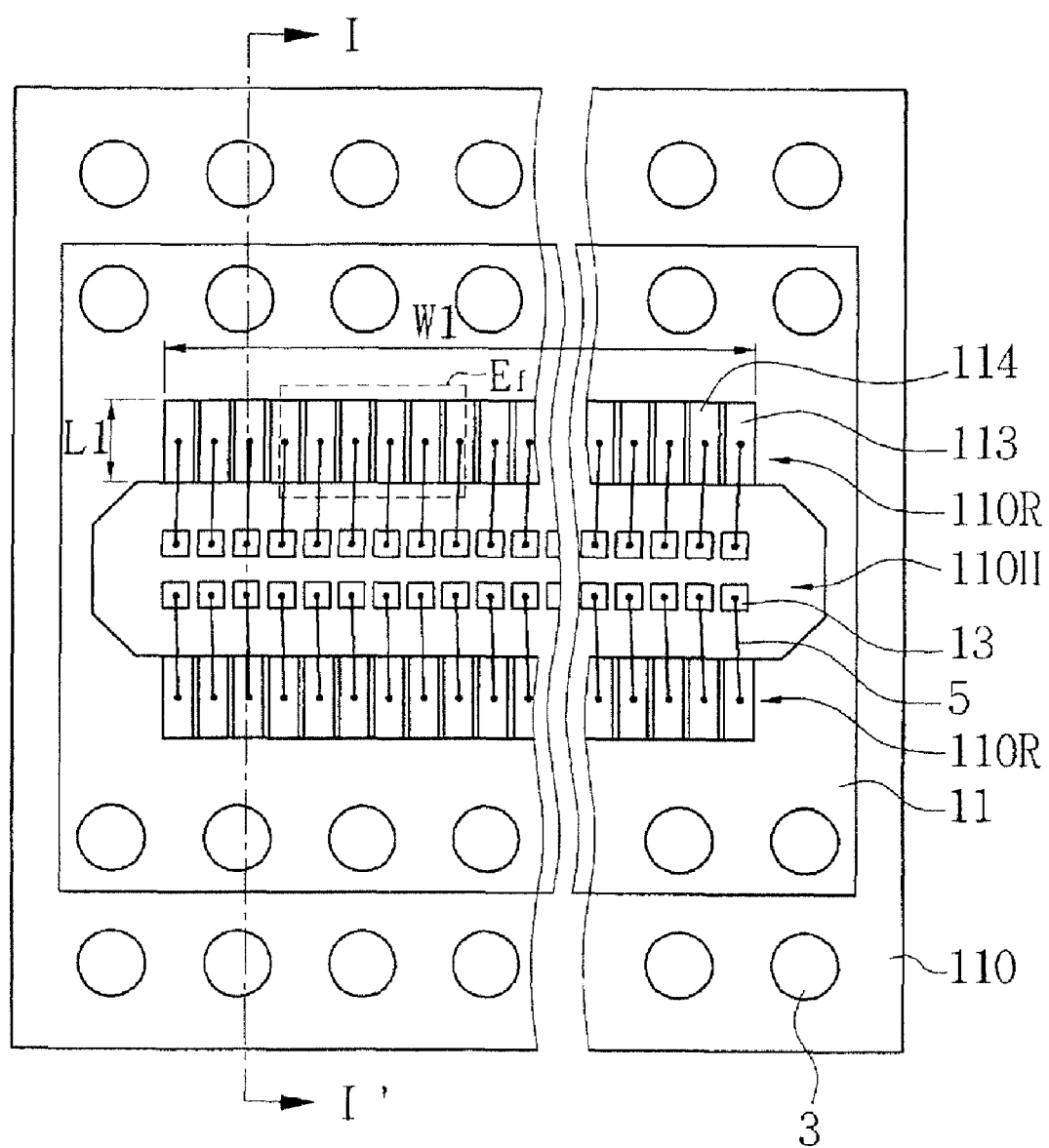
FIG. 1 is a plan view of a packaged integrated circuit chip according to a first embodiment of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Figure 2:
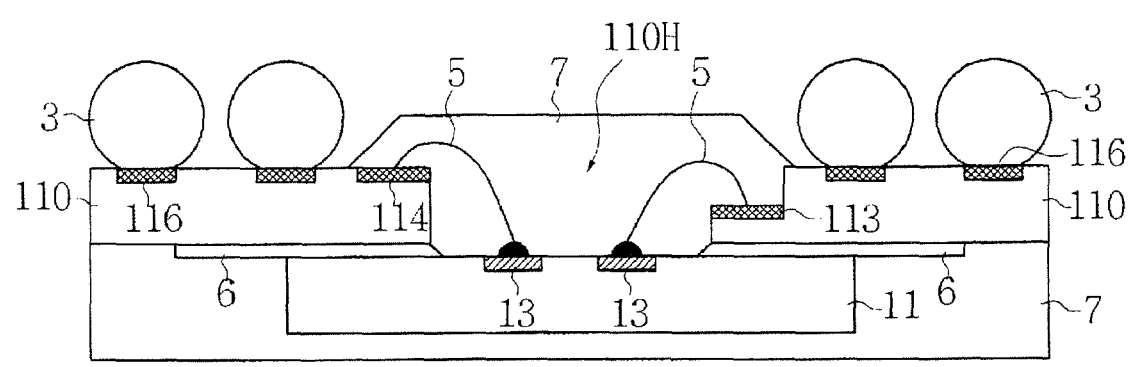
FIG. 2 is a cross-sectional view of the packaged integrated circuit chip of FIG. 1, taken along line 1-1'.

FIG. 1 is a plan view of a packaged integrated circuit chip according to a first embodiment of the present invention and FIG. 2 is a cross-sectional view of the packaged integrated circuit chip of FIG. 1, taken along line I-I' of FIG. 1. According to this first embodiment, a printed circuit board 110 (PCB), which has a central opening therein, is bonded by an adhesive layer 6 to an underlying semiconductor chip 11 having a plurality of chip pads 13 (e.g., data pads, I/O pads) thereon. The underlying chip 11 may also be encapsulated and protected by a molding compound 7 that extends along an underside of the printed circuit board 110 and into the opening 110H, as illustrated.

Figure 15:
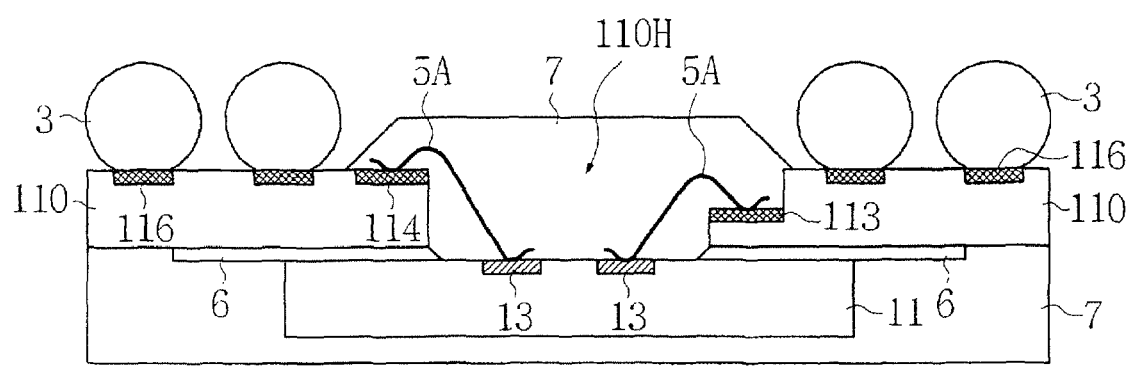
FIG. 15 is a cross-sectional view of a packaged integrated circuit chip according to additional embodiments of the present invention.

The printed circuit board 110 includes a plurality of substrate pads 116 on an upper surface thereof. As illustrated, electrical contact to these substrate pads 116 may be made by solder balls 3. According to some embodiments of the present invention, the substrate pads 116 may also be electrically connected (by through-board electrical interconnects, not shown) to respective electrically conductive bond fingers 113, 114. These bond fingers 113 and 114, which are provided at different "heights" relative to an upper surface of the chip 11, are electrically connected to corresponding ones of the chip pads 13 by electrical interconnects 5. As illustrated, these electrical interconnects 5 may be provided by wires or beam leads. For example, in FIG. 15, which is an alternative cross-sectional view of the packaged integrated circuit chip of FIG. 1, the wires 5 of FIG. 2 have been replaced by beam leads 5A. Alternatively, the electrical interconnects may be provided by solder bonds, as described more fully hereinbelow. Referring again to FIG. 1, the bond fingers 113 and 114 extend side-by-side in bond finger regions 110R, which have a width of W1. The length of the bond fingers 113 and 114 are illustrated by the reference character L1.

Figure 3:
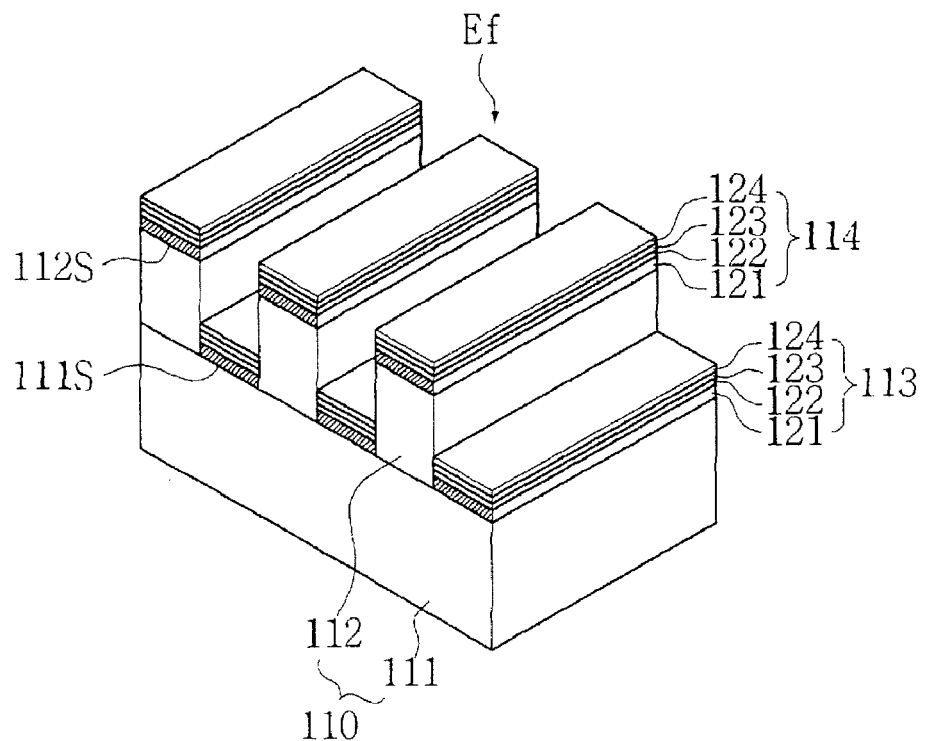
FIG. 3 is a perspective view of a plurality of the electrically conductive bond fingers ($E_f$) illustrated by FIGS. 1-2, according to some embodiments of the present invention.

FIG. 3 is a perspective view of a plurality of the bond fingers 113 and 114 illustrated by FIGS. 1-2. In FIG. 3, the printed circuit board 110 is illustrated as including a supporting base region 111 (e.g., electrically insulating base region) having a primary surface 111S thereon, and an electrically insulating supplementary region 112 extending upward from the supporting base region 111. These supplementary regions 112, which have upper surfaces 112S that are elevated relative to the primary surface 111S, advantageously provide electrical confinement to the electrical interconnects 5 of FIGS. 1-2. This electrical confinement operates to inhibit the formation of electrical "shorts" between adjacent electrical interconnects 5 that may become misaligned during formation. The lower bond fingers 113 and the upper bond fingers 114 are illustrated as including a composite stack of electrically conductive metal layers 121-124. According to some embodiments of the invention, the metal layers 121-124 may include a copper (Cu) layer 121, a nickel (Ni) layer 122, a paladium (Pd) layer 123 and a gold (Au) layer 124.

Figure 4:
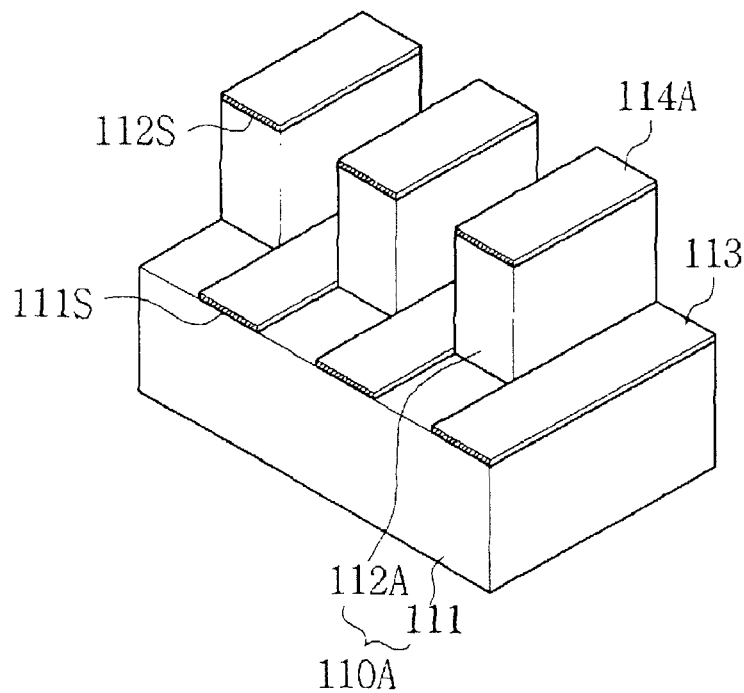
FIG. 4 is a perspective view of a plurality of the electrically conductive bond fingers ($E_f$) illustrated by FIGS. 1-2, according to some embodiments of the present invention.
Figure 5:
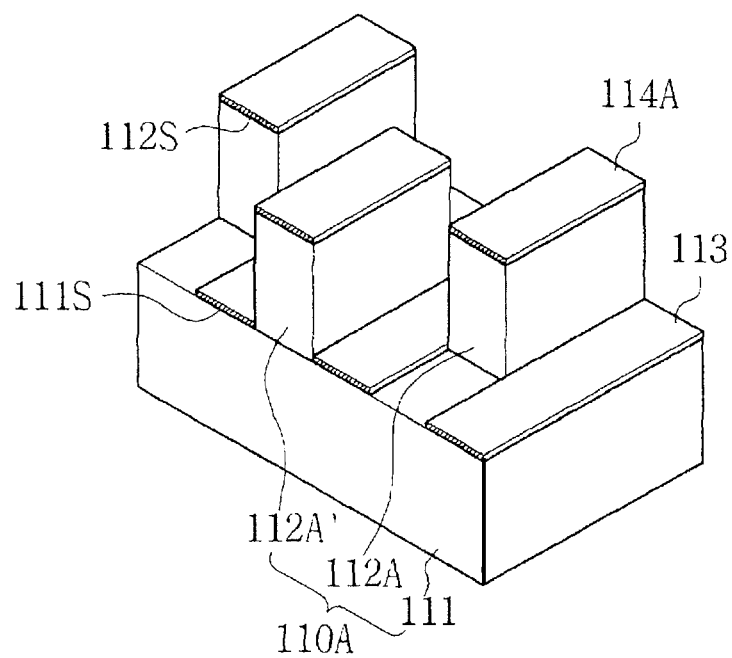
FIG. 5 is a perspective view of a plurality of the electrically conductive bond fingers ($E_f$) illustrated by FIGS. 1-2, according to some embodiments of the present invention.
Figure 6:
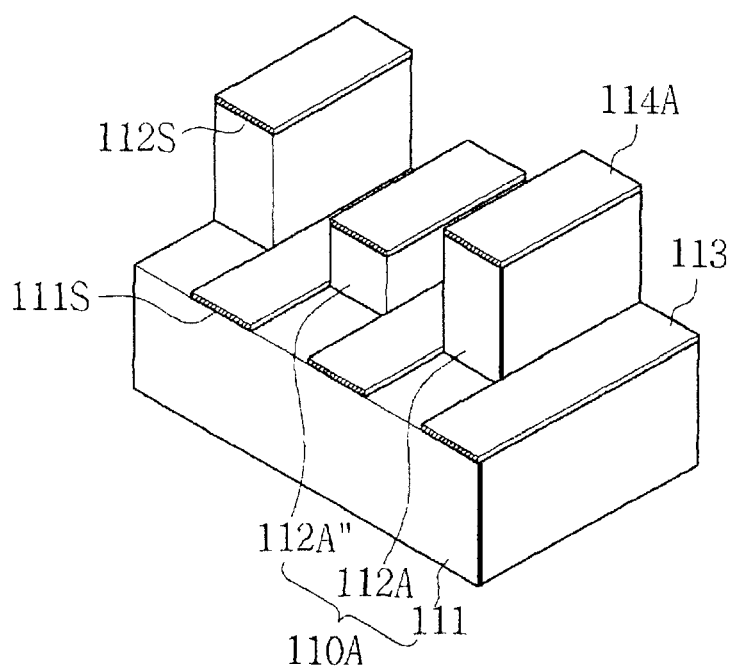
FIG. 6 is a perspective view of a plurality of the electrically conductive bond fingers ($E_f$) illustrated by FIGS. 1-2, according to some embodiments of the present invention.
Figure 7:
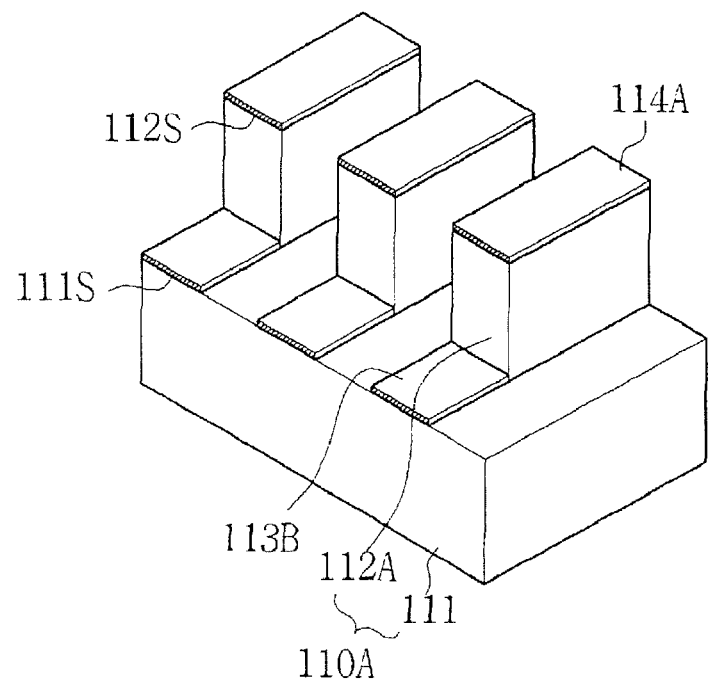
FIG. 7 is a perspective view of a plurality of the electrically conductive bond fingers ($E_f$) illustrated by FIGS. 1-2, according to some embodiments of the present invention.

Alternative embodiments of the bond fingers 113 and 114 of FIG. 3 are illustrated by FIGS. 4-14. In the embodiment of FIG. 4, the supplementary regions 112A and the supporting base region 111 collectively form a portion of the printed circuit board 110A. The supplementary regions 112A and the upper bond fingers 114A thereon are recessed relative to the lower bond fingers 113. In the embodiment of FIG. 5, the supplementary regions 112A and 112A' are arranged in a staggered front-to-back arrangement, as illustrated. In the embodiment of FIG. 6, the electrically insulating supplementary regions 112A and 112A" are formed to have different heights relative to a primary surface 111S of the supporting base region 111. In the embodiment of FIG. 7, the lower bond fingers 113B are placed in front of the upper bond fingers 114A and lateral gaps are provided between adjacent supplementary regions 112A.

Figure 8:
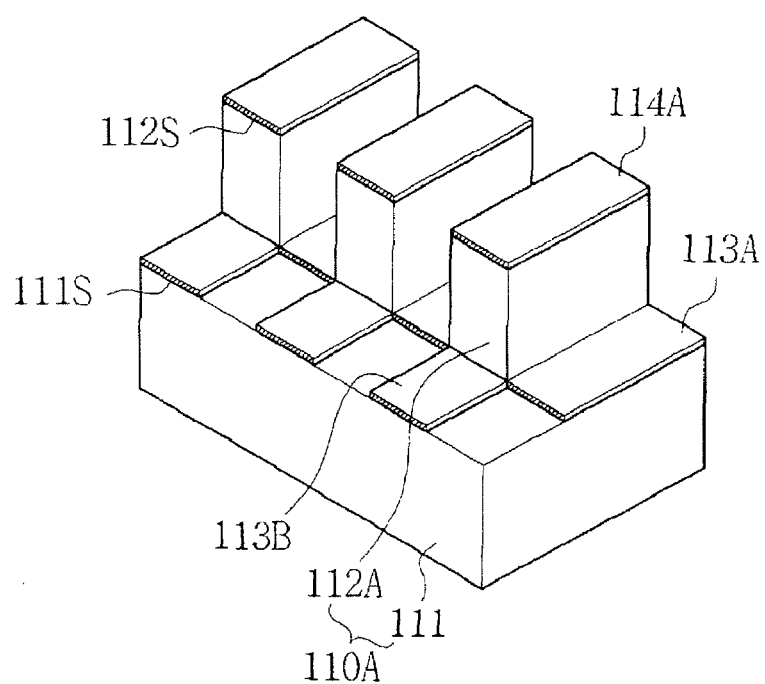
FIG. 8 is a perspective view of a plurality of the electrically conductive bond fingers ($E_f$) illustrated by FIGS. 1-2, according to some embodiments of the present invention.
Figure 9:
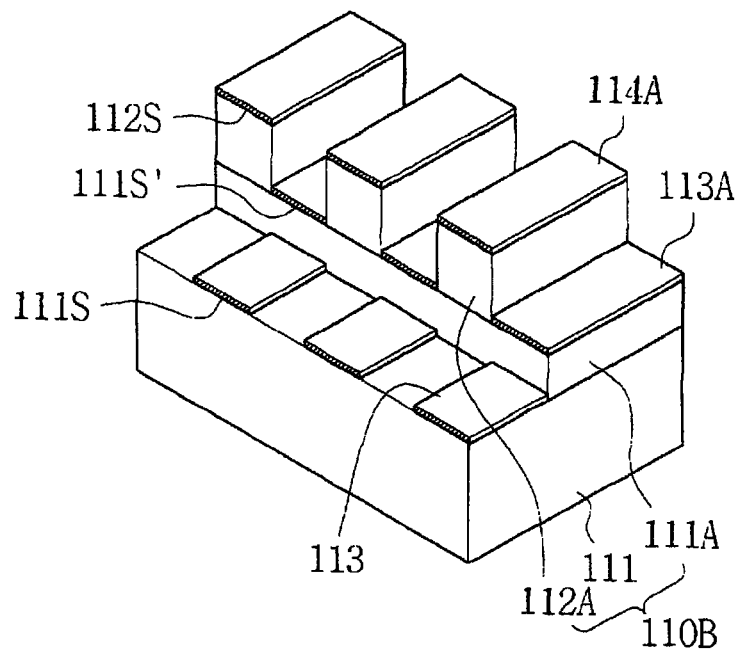
FIG. 9 is a perspective view of a plurality of the electrically conductive bond fingers ($E_f$) illustrated by FIGS. 1-2, according to some embodiments of the present invention.
Figure 10:
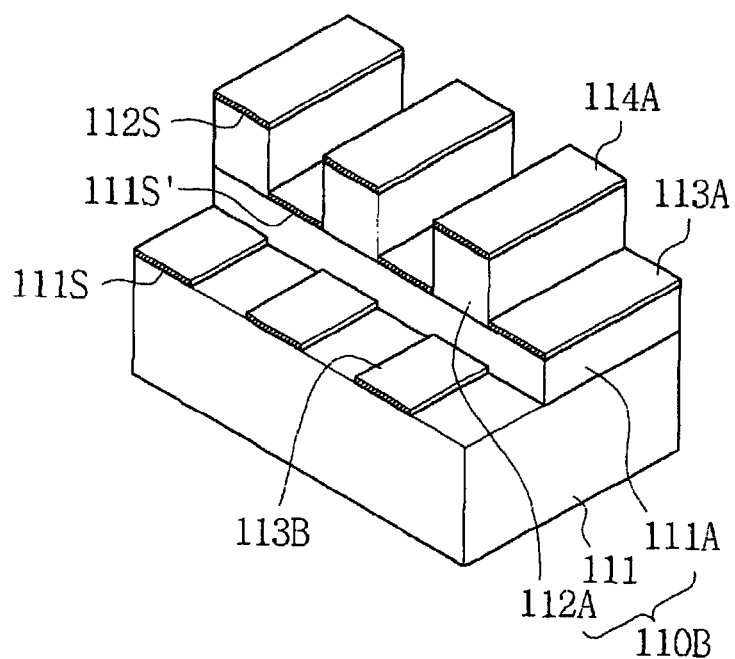
FIG. 10 is a perspective view of a plurality of the electrically conductive bond fingers ($E_f$) illustrated by FIGS. 1-2, according to some embodiments of the present invention.
Figure 11:
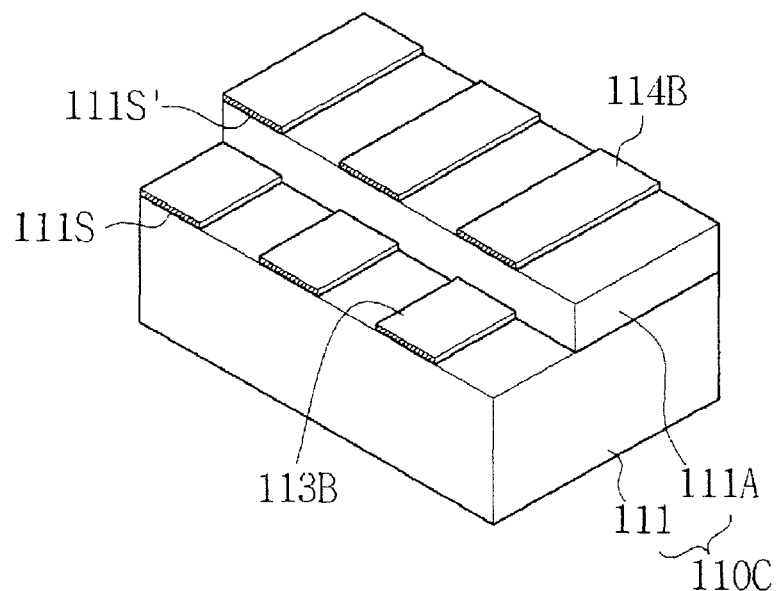
FIG. 11 is a perspective view of a plurality of the electrically conductive bond fingers ($E_f$) illustrated by FIGS. 1-2, according to some embodiments of the present invention.
Figure 12:
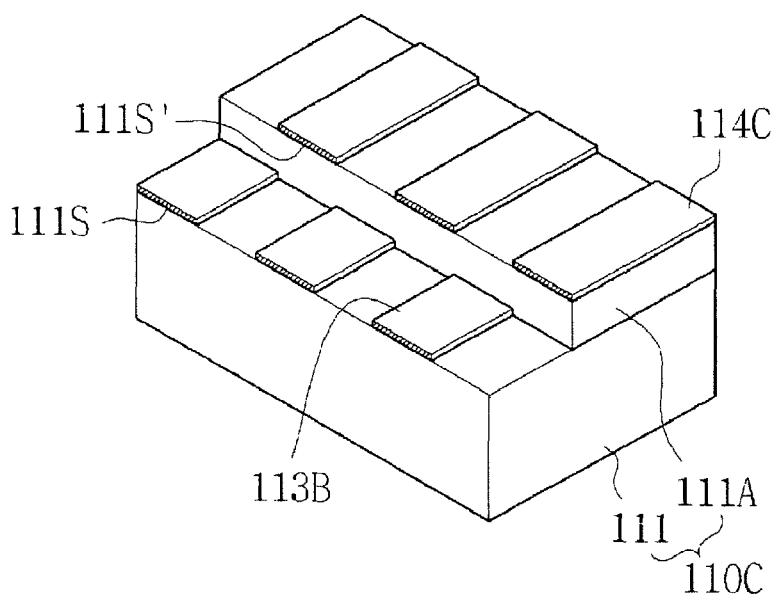
FIG. 12 is a perspective view of a plurality of the electrically conductive bond fingers ($E_f$) illustrated by FIGS. 1-2, according to some embodiments of the present invention.
Figure 13:
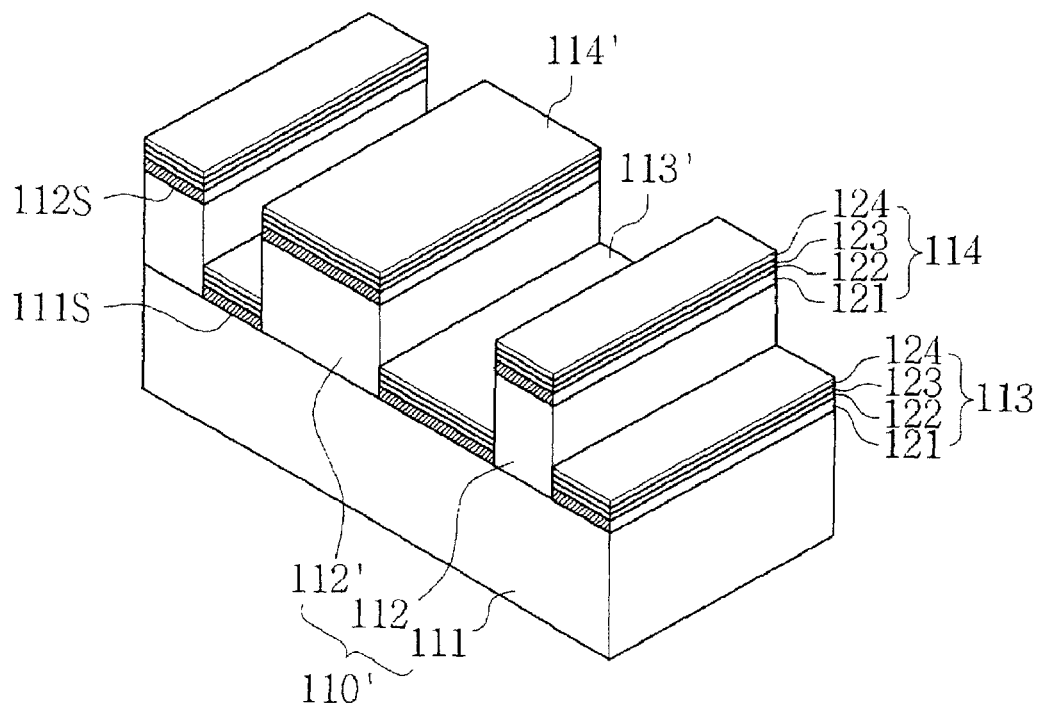
FIG. 13 is a perspective view of a plurality of the electrically conductive bond fingers ($E_f$) illustrated by FIGS. 1-2, according to some embodiments of the present invention.
Figure 14:
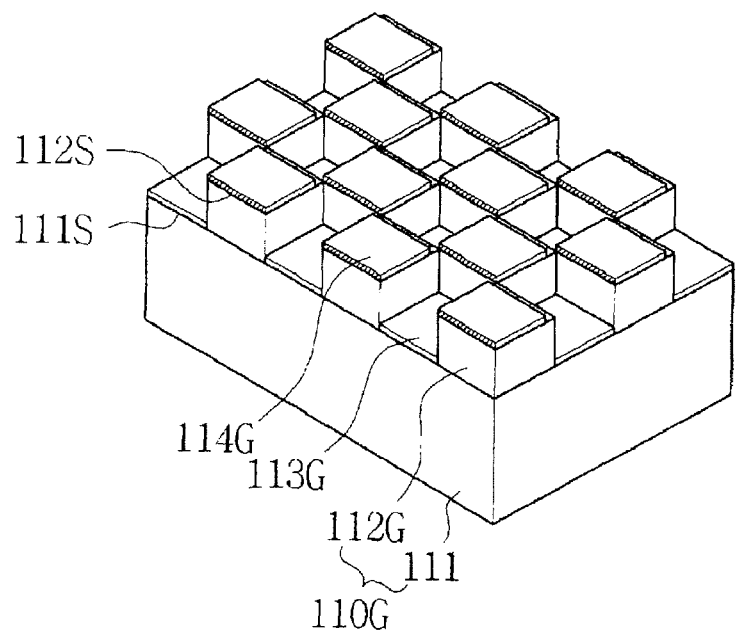
FIG. 14 is a perspective view of a plurality of the electrically conductive bond fingers ($E_f$) illustrated by FIGS. 1-2, according to some embodiments of the present invention.

In the embodiment of FIG. 8, lower bond fingers 113B are provided in front of each supplementary region 112A and lower bond fingers 113A are confined between adjacent pairs of the supplementary regions 112A. But, in the embodiment of FIG. 9, the supporting base region 111 includes an elevated base region 111A thereon along with a plurality of bond fingers 113 provided on the primary surface 111S. In this embodiment, the supplementary regions 112A are formed on the elevated base region 111A to thereby define a modified circuit board 110B. This elevated base region 111A is illustrated as including an upper surface 111S' on which the bond fingers 113A are provided and the supplementary regions 112A include upper surfaces 112S on which the upper bond fingers 114A are provided, as illustrated. The embodiment of FIG. 10 is similar to the embodiment of FIG. 9, however, the upper bond fingers 113A and lower bond fingers 113B are staggered relative to each other. The embodiments of FIGS. 11-12 are similar to the embodiment of FIG. 10, however, the modified circuit board 110C omits the supplementary regions 112A illustrated by FIG. 10 and the upper bond fingers 114B and 114C are spaced in a staggered arrangement along the elevated base region 111A. The embodiment of FIG. 13 is similar to the embodiment of FIG. 3, however, the alternating supplementary regions 112 and 112' have different widths, the upper bond fingers 114 and 114' have different widths and the lower bond fingers 113 and 113' have different widths on a printed circuit board 110'. In FIG. 14, the supporting base region 111 and the staggered array of supplementary regions 112G collectively define a modified circuit board 110G having lower bond finger patterns 113G and upper bond finger patterns 114G on the surfaces 111S and 112S, respectively.

Figure 16:
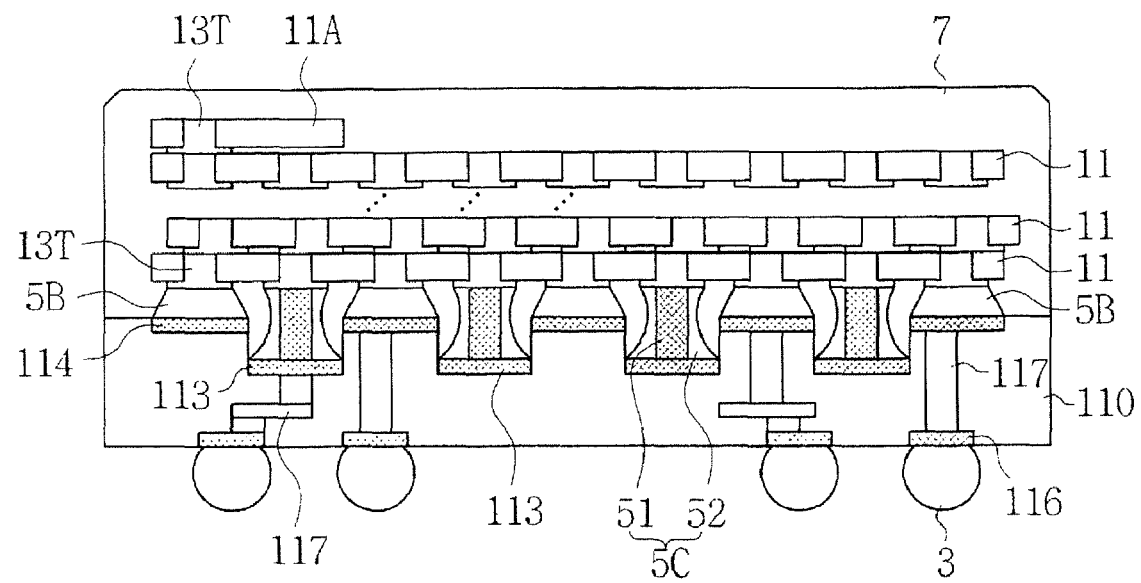
FIG. 16 is a cross-sectional view of an integrated circuit substrate according to additional embodiments of the present invention.

Referring now to FIG. 16, a packaged multi-chip substrate according to additional embodiments of the present invention will be described. This multi-chip substrate includes a printed circuit board 110 having lower bond fingers 113 and upper bond fingers 114 thereon. These bond fingers 113 and 114 may be electrically connected by electrical interconnects 117 to respective substrate pads 116 having solder balls 3 thereon, which extend adjacent an underside of the circuit board 110. The multi-chip substrate includes a plurality of semiconductor chips 11 and 11A that are stacked together and protected by a molding compound 7. These chips 11 and 11A may be electrically connected to each other by through-substrate vias 13T. Some of these through-substrate vias 13T are electrically connected to the upper bond fingers 114 by respective solder connections 5B and other through-substrate vias 13T are electrically connected to the lower bond fingers 113 by electrically conductive spacers 5C. These electrically conductive spacers 5C are illustrated as including electrically conductive plugs 51 that are surrounded by solder bonds 52. Advantageously, the use of lower and upper bond fingers 113 and 114 supports a higher degree of reliability to the solder connections 5B and 52 by providing a larger effective spacing (e.g., three-dimensional spacing) between adjacent fingers.

Figure 17:
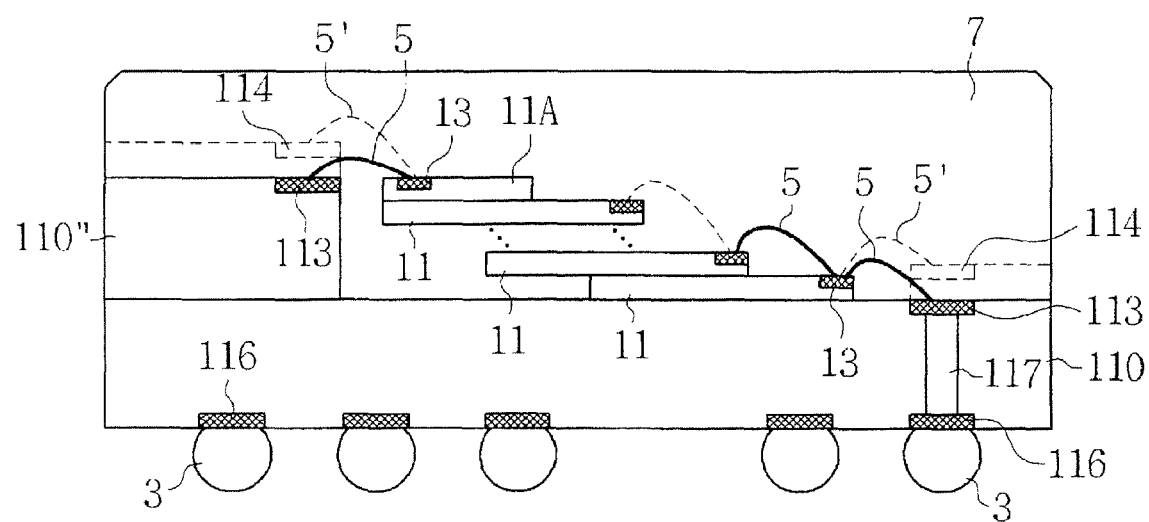
FIG. 17 is a cross-sectional view of an integrated circuit substrate according to additional embodiments of the present invention.

FIG. 17 illustrates packaged multi-chip integrated circuit device according to an additional embodiment of the invention. According to this embodiment of the invention, a plurality of integrated circuit chips 11, 11A are provided in a stacked arrangement, within a molding compound 7. Each of these chips 11 and 11A includes chip pads 13 thereon that may be electrically connected together by wire connections 5. A first printed circuit board 110 and a second printed circuit board 110" are both provided with lower and upper bond fingers 113 and 114, which are electrically connected to respective chip pads 13 by the wire connections 5 and 5'. As illustrated, the lower and upper bond fingers 113 and 114 are electrically connected to respective substrate pads 116 by through-substrate interconnections 117. Solder balls 3 are also provided on the substrate pads 116, as illustrated.

Figure 18:
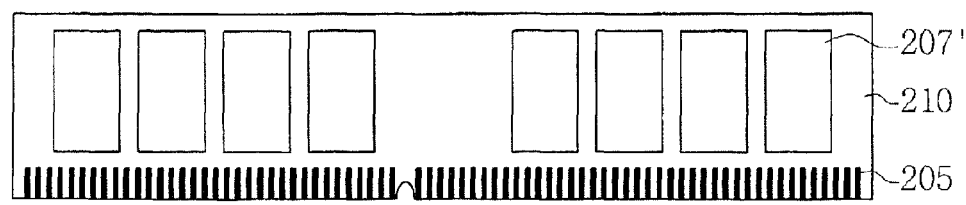
FIG. 18 is a plan view of a memory module board containing a plurality of integrated circuit substrates according to embodiments of the present invention.
Figure 19:
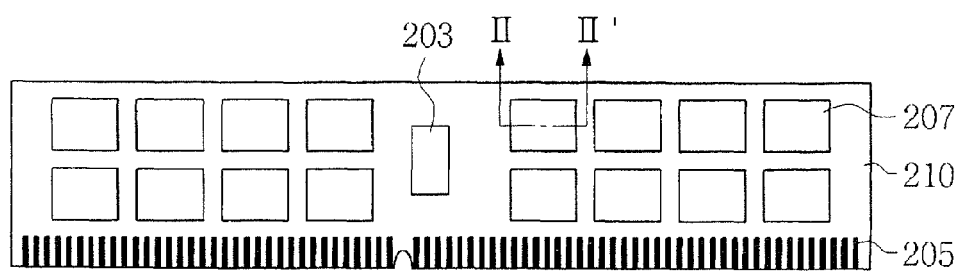
FIG. 19 is a plan view of a memory module board containing a plurality of integrated circuit substrates according to embodiments of the present invention.
Figure 20:
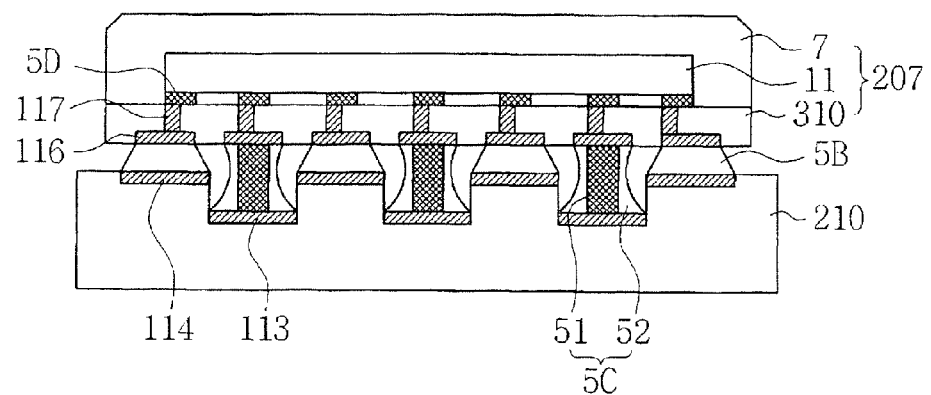
FIG. 20 is a cross-sectional view of the memory module board of FIG. 19, taken along line II-II'.

In FIGS. 18-19, a module board 210 with input-output terminals 205 is provided with a plurality of semiconductor packages 207, 207' thereon that may be formed according to embodiments of the present invention. The module board 210 of FIG. 19 also includes a controller unit 203. FIG. 20 is a cross-sectional view of the module board 210 of FIG. 19, taken along line II-II'. As illustrated by FIG. 20, the semiconductor package 207 includes a package substrate 310 with a chip 11 thereon that is protected by a molding compound 7. This chip 11 includes solder bonds 5D that are connected to vertical interconnections 117. These vertical interconnections 117 are electrically connected to lower and upper bond fingers 113 and 114, as illustrated. These electrical connections are provided by solder connections 5B and electrically conductive spacers 5C, which include electrically conductive plugs 51 (surrounded by solder bonds 52).

Figure 21:
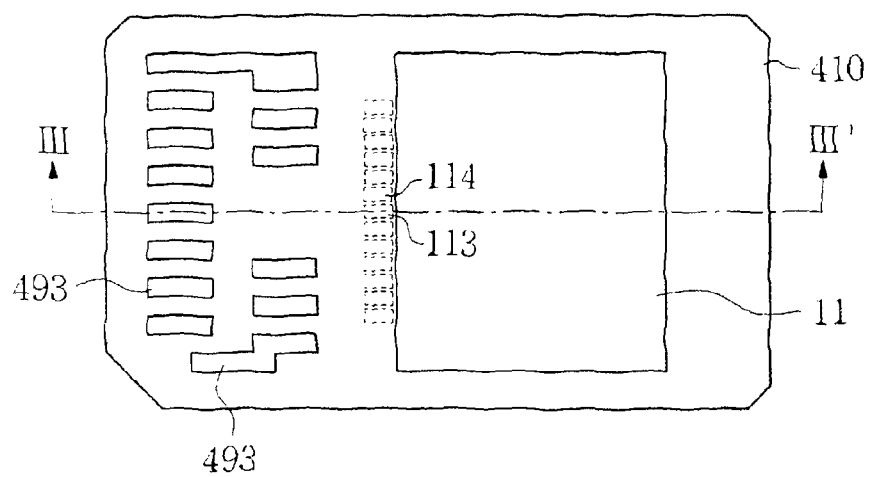
FIG. 21 is a plan view of a card substrate according to additional embodiments of the present invention.
Figure 22:
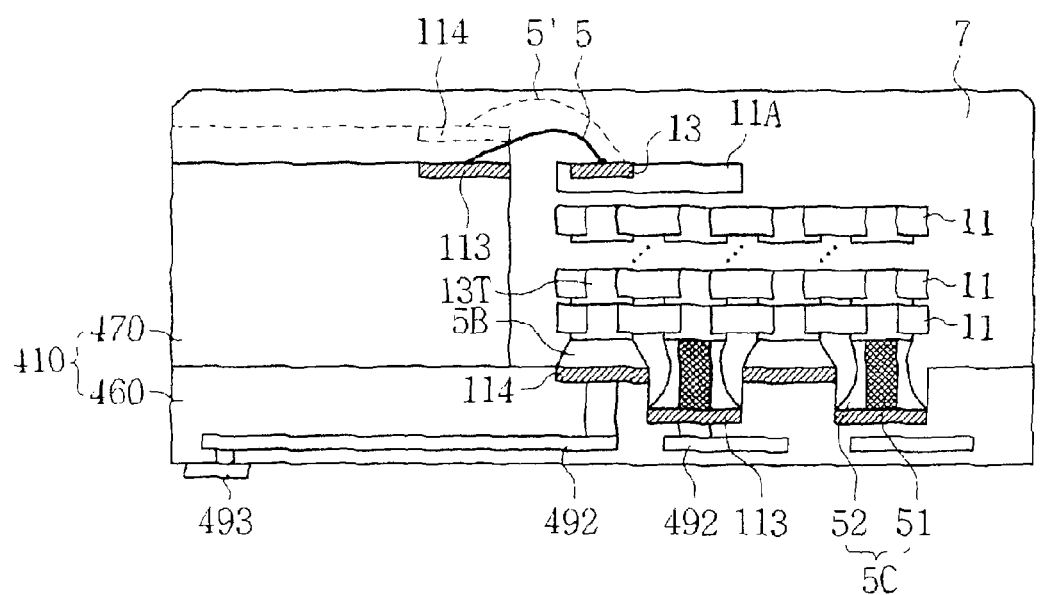
FIG. 22 is a cross-sectional view of the card substrate of FIG. 21.

FIG. 21 is a plan view of a card substrate 410 according to additional embodiments of the present invention and FIG. 22 is a cross-sectional view of the card substrate of FIG. 21, taken along line III-III'. This card substrate 410 includes external terminals 493 thereon and first and second substrates 460 and 470, respectively. Each of these substrates include lower and upper bond fingers 113 and 114, as illustrated. These external terminals 493 are connected by internal interconnections to respective lower and upper bond fingers 113 and 114, as illustrated by FIG. 22. A molding compound 7 is also provided having a plurality of chips 11 therein, which are electrically connected as illustrated by FIG. 16.

Figure 23:
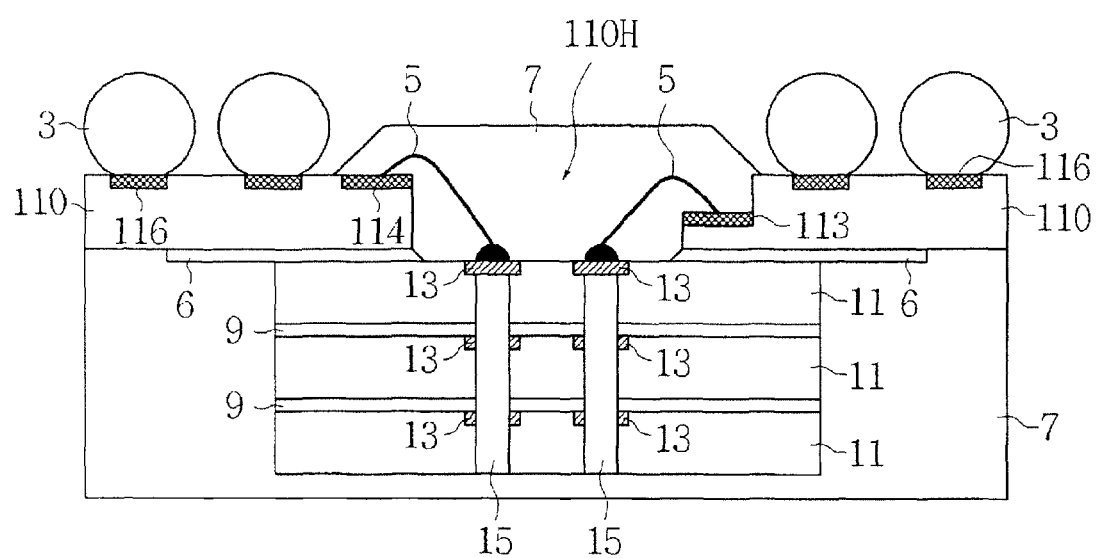
FIG. 23 is an alternative cross-sectional view of the packaged integrated circuit chip of FIG. 1, with the illustrated chip including a vertical stack of multiple chips that are electrically interconnected using through-substrate vias (TSV).

FIG. 23 is an alternative cross-sectional view of the packaged integrated circuit chip of FIG. 1, with the illustrated chip 11 of FIG. 1 actually including a vertical stack of multiple chips 11 that are electrically interconnected using through-substrate vias 15 (TSV). As illustrated by FIG. 23, the vertical stack of chips 11 are bonded together using adhesive layers 9 and protected by the surrounding molding compound 7. Each chip is also illustrated as including respective chip pads 13 thereon. In some of these embodiments of the invention, the through-substrate vias 15 may extend through corresponding ones of the chip pads 13, as illustrated.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit substrate, comprising:
   an integrated circuit chip having a plurality of electrically conductive pads on a surface thereof;
   a printed circuit board mounted to said integrated circuit chip, said printed circuit board comprising:
      an alternating arrangement of first and second electrically conductive bond fingers elevated at first and second different heights, respectively, relative to the plurality of electrically conductive pads; and
      a first plurality of electrically insulating pedestals supporting respective ones of the first electrically conductive bond fingers at elevated heights relative to the second electrically conductive bond fingers;
   a first plurality of electrical interconnects electrically connecting first ones of the plurality of electrically conductive pads to respective ones of the first electrically conductive bond fingers; and
   a second plurality of electrical interconnects electrically connecting second ones of the plurality of electrically conductive pads to respective ones of the second electrically conductive bond fingers;
   wherein said integrated circuit chip is flip-chip mounted to said printed circuit board; and
   wherein the first and second plurality of electrical interconnects are solder bonds.

2. The integrated circuit substrate of claim 1, wherein each of the second electrically conductive bond fingers is confined at least partially on opposing sides by a pair of the first plurality of electrically insulating pedestals.

3. The integrated circuit substrate of claim 1, wherein the first and second plurality of electrical interconnects are selected from a group consisting of wires and beam leads.

4. The integrated circuit substrate of claim 3, wherein the first and second plurality of electrical interconnects have equivalent lengths.

5. An integrated circuit substrate, comprising:
   an integrated circuit chip having a plurality of electrically conductive pads on a surface thereof;
   a printed circuit board mounted to said integrated circuit chip, said printed circuit board comprising:
      an alternating arrangement of first and second electrically conductive bond fingers elevated at first and second different heights, respectively, relative to the plurality of electrically conductive pads; and a first plurality of electrically insulating pedestals supporting respective ones of the first electrically conductive bond fingers at elevated heights relative to the second electrically conductive bond fingers;

a first plurality of electrical interconnects electrically connecting first ones of the plurality of electrically conductive pads to respective ones of the first electrically conductive bond fingers; and a second plurality of electrical interconnects electrically connecting second ones of the plurality of electrically conductive pads to respective ones of the second electrically conductive bond fingers;

wherein said integrated circuit chip is flip-chip mounted to a first side of said printed circuit board containing the alternating arrangement of the first and second electrically conductive bond fingers; and wherein a second side of said printed circuit board comprises a plurality of substrate pads thereon that are electrically connected by through-substrate vias to the first and second electrically conductive bond fingers.

6. An integrated circuit substrate, comprising:

an integrated circuit chip having a plurality of electrically conductive pads on a surface thereof;

a printed circuit board mounted to said integrated circuit chip, said printed circuit board comprising:

an alternating arrangement of first and second electrically conductive bond fingers elevated at first and second different heights, respectively, relative to the plurality of electrically conductive pads; and a first plurality of electrically insulating pedestals supporting respective ones of the first electrically conductive bond fingers at elevated heights relative to the second electrically conductive bond fingers;

a first plurality of electrical interconnects electrically connecting first ones of the plurality of electrically conductive pads to respective ones of the first electrically conductive bond fingers; and a second plurality of electrical interconnects electrically connecting second ones of the plurality of electrically conductive pads to respective ones of the second electrically conductive bond fingers;

wherein said integrated circuit chip is flip-chip mounted to a first side of said printed circuit board using solder bonds that electrically connect the alternating arrangement of the first and second electrically conductive bond fingers to the plurality of electrically conductive pads.

7. A packaged multi-chip integrated circuit device, comprising:

a first integrated circuit chip having a first plurality of electrically conductive pads on a surface thereof;

a second integrated circuit chip on said first integrated circuit chip, said first integrated circuit chip having a second plurality of electrically conductive pads on a surface thereof;

a printed circuit board mounted to said first and second integrated circuit chips, said printed circuit board comprising:

an alternating arrangement of first and second electrically conductive bond fingers elevated at first and second different heights, respectively, relative to the first plurality of electrically conductive pads;

an alternating arrangement of third and fourth electrically conductive bond fingers elevated at third and fourth different heights, respectively, relative to the second plurality of electrically conductive pads;

a first plurality of electrically insulating pedestals supporting respective ones of the first electrically conductive bond fingers at elevated heights relative to the second electrically conductive bond fingers; and a second plurality of electrically insulating pedestals supporting respective ones of the third electrically conductive bond fingers at elevated heights relative to the fourth electrically conductive bond fingers;

a first plurality of electrical interconnects electrically connecting respective ones of the first plurality of electrically conductive pads to respective ones of the first electrically conductive bond fingers;

a second plurality of electrical interconnects electrically connecting respective ones of the first plurality of electrically conductive pads to respective ones of the second electrically conductive bond fingers a third plurality of electrical interconnects electrically connecting respective ones of the second plurality of electrically conductive pads to respective ones of the third electrically conductive bond fingers; and a fourth plurality of electrical interconnects electrically connecting respective ones of the second plurality of electrically conductive pads to respective ones of the fourth electrically conductive bond fingers.

8. The integrated circuit device of claim 7, wherein said printed circuit board comprises:

a plurality of substrate pads on a first surface thereof; and an electrically conductive via extending through said printed circuit board and electrically connecting one of the first, second, third and fourth electrically conductive bond fingers to a corresponding one of the plurality of substrate pads.

9. An integrated circuit substrate, comprising:

a first integrated circuit chip having a plurality of electrically conductive pads on a surface thereof;

a printed circuit board mounted to said first integrated circuit chip, said printed circuit board comprising a first bond finger confined on opposite sides by a pair of electrically insulating pedestals, and a pair of second bond fingers on the pair of electrically insulating pedestals; and three immediately adjacent electrically conductive wires contacting the first and second bond fingers at first ends thereof and contacting three immediately adjacent pads on the surface of said integrated circuit chip at second ends thereof.

10. The integrated circuit substrate of claim 9, further comprising a plurality of solder balls on said printed circuit board, said plurality of solder balls electrically connected to respective ones of the first and second bond fingers.

11. The integrated circuit substrate of claim 10, wherein the plurality of solder balls contact said printed circuit board at an interface that is planar with the second bond fingers.

12. The integrated circuit substrate of claim 10, wherein the first bond finger has an unequal width relative to at least one of the second bond fingers.

13. The integrated circuit substrate of claim 10, further comprising a second plurality of integrated circuit chips bonded to said first integrated circuit chip.

14. The integrated circuit substrate of claim 13, further comprising a through-substrate via electrically connecting a pad on one of said second plurality of integrated circuit chips to a corresponding one of the plurality of electrically conductive pads.

* * * * *